(12) United States Patent
Suo

(10) Patent No.: US 12,534,826 B2
(45) Date of Patent: Jan. 27, 2026

(54) SiC SUBSTRATE AND SiC EPITAXIAL WAFER

(71) Applicant: Resonac Corporation, Tokyo (JP)

(72) Inventor: Hiromasa Suo, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/809,911

(22) Filed: Aug. 20, 2024

(65) Prior Publication Data

US 2025/0066949 A1    Feb. 27, 2025

(30) Foreign Application Priority Data

Aug. 24, 2023    (JP) ................. 2023-136613

(51) Int. Cl.
*C30B 29/36*    (2006.01)
*B32B 3/00*    (2006.01)

(52) U.S. Cl.
CPC ............... *C30B 29/36* (2013.01); *B32B 3/00* (2013.01)

(58) Field of Classification Search
CPC .................................................. C30B 29/36
See application file for complete search history.

(56) References Cited

U.S. PATENT DOCUMENTS

| | | | |
|---|---|---|---|
| 9,099,377 B2* | 8/2015 | Basceri | H10D 62/8325 |
| 12,266,693 B2* | 4/2025 | Nishihara | H01L 21/02529 |
| 2016/0208412 A1* | 7/2016 | Sandgren | H01L 21/02529 |
| 2017/0321345 A1* | 11/2017 | Xu | C30B 29/36 |
| 2021/0189591 A1* | 6/2021 | Xu | C30B 29/36 |
| 2022/0270875 A1* | 8/2022 | Sinquin | H01L 21/02502 |
| 2024/0150931 A1* | 5/2024 | Xu | C01B 33/025 |

FOREIGN PATENT DOCUMENTS

| | | |
|---|---|---|
| CN | 115573030 A | 1/2023 |
| JP | 9-221397 A | 8/1997 |
| JP | 2016-127201 A | 7/2016 |
| JP | 6373443 B2 | 8/2018 |
| KR | 10-2016-0043001 A | 4/2016 |
| KR | 10-2018-0044999 A | 5/2018 |

OTHER PUBLICATIONS

N. Piluso, et al., "Micro-Raman evaluation of 200 mm SiC material", Microelectronic Engineering, 2023, pp. 1-3, vol. 273, No. 111962.

* cited by examiner

*Primary Examiner* — Elizabeth E Mulvaney
(74) *Attorney, Agent, or Firm* — Sughrue Mion, PLLC

(57) ABSTRACT

A SiC substrate according to the present embodiment has a diameter of 195 mm or more and a micropipe density of $0.01/cm^2$ or less.

16 Claims, 4 Drawing Sheets

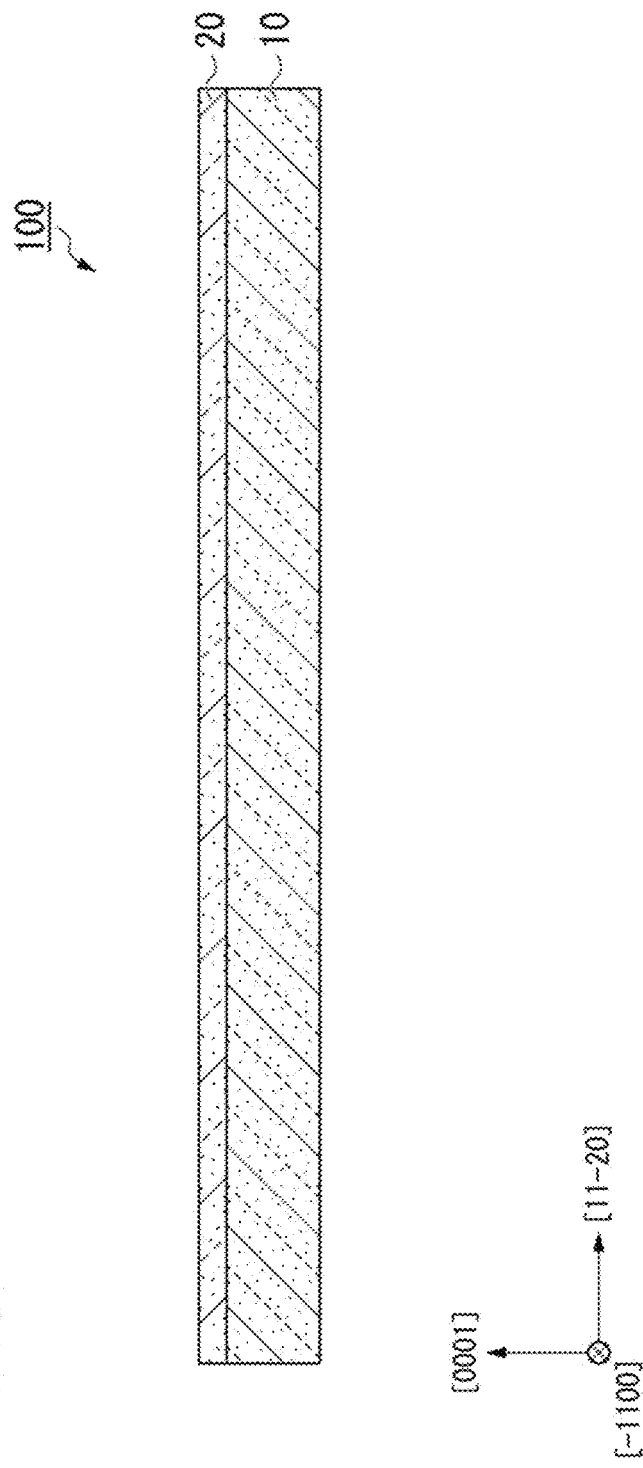

SiC SUBSTRATE AND SiC EPITAXIAL WAFER

BACKGROUND

Field

The present disclosure relates to a SiC substrate and a SiC epitaxial wafer. Priority is claimed on Japanese Patent Application No. 2023-136613 filed on Aug. 24, 2023, the contents of which are incorporated herein by reference.

Description of Related Art

Silicon carbide (SiC) has a dielectric breakdown electric field that is an order of magnitude larger than that of silicon (Si) and a band gap that is three times larger than that of silicon (Si). Also, silicon carbide (SiC) has characteristics such as a thermal conductivity that is about three times higher than that of silicon (Si). Therefore, silicon carbide (SiC) is expected to be applied to power devices, high-frequency devices, high-temperature operation devices, and the like. For this reason, in recent years, SiC epitaxial wafers have come to be used in such semiconductor devices described above.

A SiC epitaxial wafer is obtained by laminating a SiC epitaxial layer on a surface of a SiC substrate. Hereinafter, a substrate before the SiC epitaxial layer is laminated thereon is referred to as the SiC substrate, and a substrate after the SiC epitaxial layer is laminated thereon is referred to as the SiC epitaxial wafer. The SiC substrate is produced by slicing a SiC ingot. SiC devices such as power devices, high-frequency devices, and high-temperature operation devices are obtained by forming devices on the SiC epitaxial layer of the SiC epitaxial wafer and then dicing the SiC epitaxial wafer into chips.

In order to increase the number of SiC devices obtainable from one SiC epitaxial wafer, there is a demand for increasing a diameter of the SiC substrate and SiC epitaxial wafer. However, increasing a diameter of the SiC substrate and SiC epitaxial wafer is not easy. For example, Non-Patent Document 1 describes that the number of defects increases significantly as a diameter of the SiC substrate and SiC epitaxial wafer increases.

Also, one of the defects contained in the SiC substrate is micropipes (for example, see Patent Document 1). Micropipes are one of killer defects that adversely affect subsequent processes and SiC devices. Micropipes, for example, cause poor breakdown voltage in SiC devices. Micropipes are crystal defects that are hollow inside, each have a diameter ranging from sub-micrometers to several micrometers, and propagate in a c-axis direction of hexagonal silicon carbide. Micropipes are believed to be formed because screw dislocations with large Burgers vectors alleviate strain energy.

PATENT DOCUMENTS

[Patent Document 1] Japanese Unexamined Patent Application, First Publication No. 2016-127201

Non-Patent Documents

[Non-Patent Document 1] N. Piluso, E. Carria, R. Anzalone, A Severino. Microelectronic Engineering 273 (2023) 111962.

SUMMARY

As described in Patent Document 1, micropipes are defects that are difficult to completely eliminate. Also, this tendency becomes more pronounced as SiC substrates increase in diameter.

The present disclosure has been made in view of the above-described problems, and an objective of the present disclosure is to provide a SiC substrate and a SiC epitaxial wafer that are large in diameter and have few micropipes.

The present inventors produced a SiC substrate and a SiC epitaxial wafer having few micropipes even when they have a large diameter.

(1) A SiC substrate according to a first aspect has a diameter of 195 mm or more and a micropipe density of $0.01/cm^2$ or less.

(2) In the SiC substrate according to the above described aspect, the number of micropipes in an effective region excluding an edge exclusion region within 3 mm from an outer circumference may be three or less.

(3) In the SiC substrate according to the above described aspect, the number of micropipes in an effective region excluding an edge exclusion region within 3 mm from an outer circumference may be one or less.

(4) In the SiC substrate according to the above described aspect, among a plurality of first regions obtained by partitioning a surface into squares each having an area of $4\ mm^2$, 7209 or more of the first regions may have no micropipes.

(5) In the SiC substrate according to the above described aspect, among a plurality of second regions obtained by partitioning a surface into squares each having an area of $9\ mm^2$, 3168 or more of the second regions may have no micropipes.

(6) In the SiC substrate according to the above described aspect, among a plurality of third regions obtained by partitioning a surface into squares each having an area of $16\ mm^2$, 1764 or more of the third regions may have no micropipes.

(7) In the SiC substrate according to the above described aspect, among a plurality of fourth regions obtained by partitioning a surface into squares each having an area of $25\ mm^2$, 1116 or more of the fourth regions may have no micropipes.

(8) In the SiC substrate according to the above described aspect, among a plurality of fifth regions obtained by partitioning a surface into squares each having an area of $36\ mm^2$, 764 or more of the fifth regions may have no micropipes.

(9) In the SiC substrate according to the above described aspect, among a plurality of sixth regions obtained by partitioning a surface into squares each having an area of $49\ mm^2$, 556 or more of the sixth regions may have no micropipes.

(10) In the SiC substrate according to the above described aspect, among a plurality of seventh regions obtained by partitioning a surface into squares each having an area of $64\ mm^2$, 421 or more of the seventh regions may have no micropipes.

(11) In the SiC substrate according to the above described aspect, among a plurality of eighth regions obtained by partitioning a surface into squares each having an area of $81\ mm^2$, 329 or more of the eighth regions may have no micropipes.

(12) In the SiC substrate according to the above described aspect, among a plurality of ninth regions obtained by partitioning a surface into squares each having an area of 100 mm², 262 or more of the ninth regions may have no micropipes.
(13) In the SiC substrate according to the above described aspect, among a plurality of tenth regions obtained by partitioning a surface into squares each having an area of 225 mm², 112 or more of the tenth regions may have no micropipes.
(14) In the SiC substrate according to the above described aspect, among a plurality of eleventh regions obtained by partitioning a surface into squares each having an area of 400 mm², 58 or more of the eleventh regions may have no micropipes.
(15) The SiC substrate according to the above described aspect may have a diameter of 205 mm or less.
(16) A SiC epitaxial wafer according to a second aspect includes the SiC substrate according to the above-described aspect, and a SiC epitaxial layer laminated on the SiC substrate.

The SiC substrate and the SiC epitaxial wafer according to the above-described aspects have a large diameter and few micropipes.

BRIEF DESCRIPTION OF THE DRAWINGS

FIG. 4 is a cross-sectional view of a SiC epitaxial wafer according to the present embodiment.

DETAILED DESCRIPTION

Figure 1:
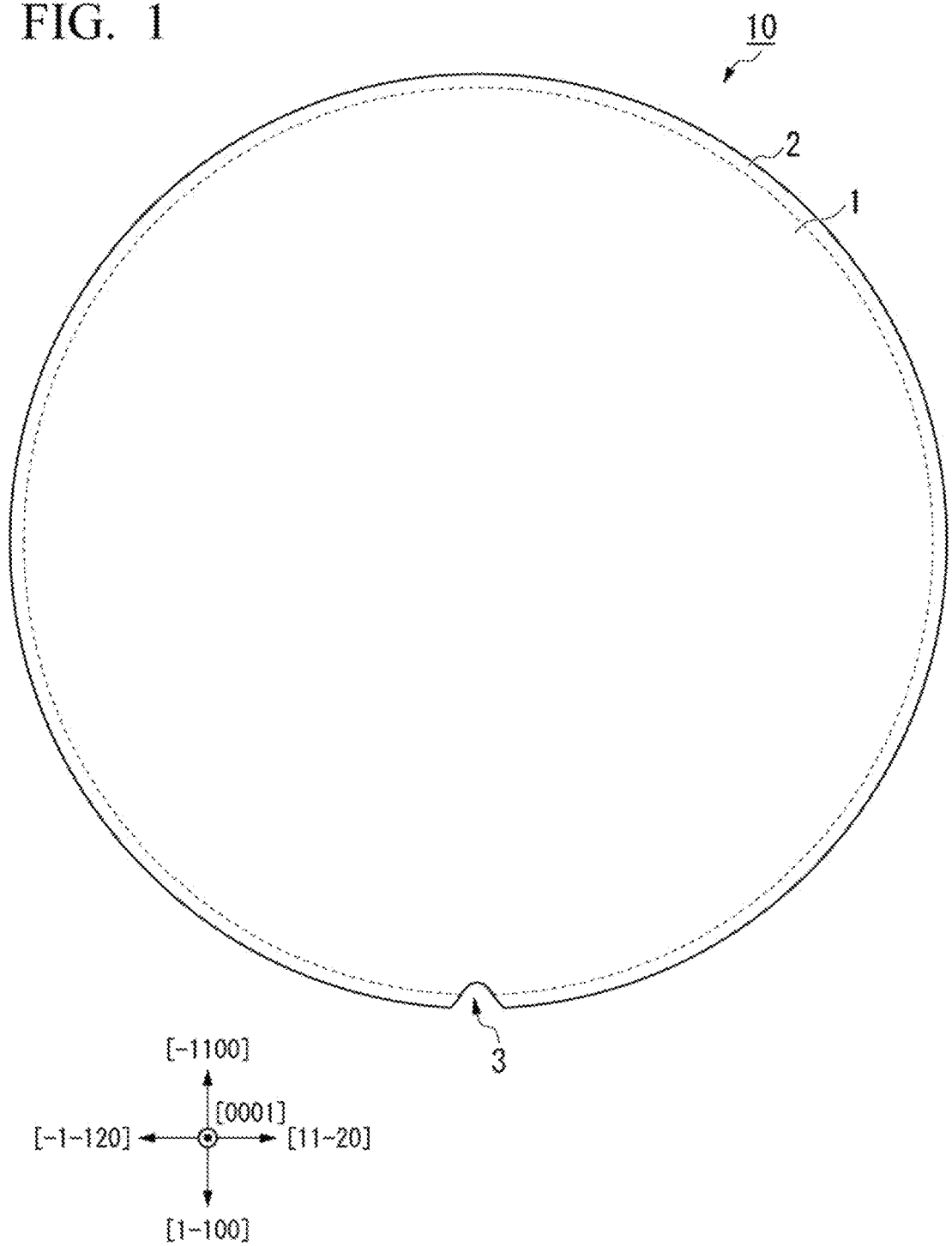
FIG. 1 is a plan view of a SiC substrate according to the present embodiment.

Hereinafter, a SiC substrate, a SiC epitaxial wafer, and the like according to the present embodiment will be described in detail with reference to the drawings as appropriate. In the drawings used in the following description, there are cases in which characteristic portions are enlarged for convenience of illustration so that characteristics of the present embodiment can be easily understood, and dimensional proportions or the like of components may be different from actual ones. Materials, dimensions, and the like illustrated in the following description are merely examples, and the present disclosure is not limited thereto and can be implemented with appropriate modifications within a range not changing the gist of the present disclosure.

In the present specification, individual directions are indicated by [ ] and collective directions are indicated by < >. For negative exponents, a "-" (bar) is placed above the number as is customary in crystallography, but in the present specification, a negative sign is placed in front of the number.

FIG. 1 is a plan view of a SiC substrate 10 according to the present embodiment. FIG. 1 is a view of the SiC substrate from a <0001> direction. The SiC substrate 10 is made of, for example, n-type SiC. A polytype of the SiC substrate 10 is not particularly limited and may be any of 2H, 3C, 4H, and 6H. The SiC substrate 10 is, for example, 4H—SiC.

A shape of the SiC substrate 10 in a plan view is substantially circular. The SiC substrate 10 may have a notch 3 allowing ascertaining of a direction of a crystal axis. Also, the SiC substrate 10 may have an orientation flat instead of the notch 3.

A diameter of the SiC substrate 10 is, for example, 195 mm or more, and preferably 199 mm or more. Also, the diameter of the SiC substrate 10 is preferably 205 mm or less, and more preferably 201 mm or less. The diameter of the SiC substrate 10 is preferably 195 mm or more and 205 mm or less, and more preferably 199 mm or more and 201 mm or less.

The SiC substrate 10 has an effective region 1 and an edge exclusion region 2. The effective region 1 is a region used for obtaining devices, and is a region of the SiC substrate 10 excluding the edge exclusion region 2. The edge exclusion region 2 is a region within 3 mm from an outer circumference. The edge exclusion region 2 is a region that is generally not used for device fabrication.

The SiC substrate 10 according to the present embodiment has a micropipe density of 0.01/cm² or less. Also, in the SiC substrate 10 according to the present embodiment, the number of micropipes is three or less, preferably one or less, and more preferably zero. Also, the number of micropipes in the effective region 1 is, for example, 3 or less, preferably 1 or less, and more preferably 0.

The micropipe is a hollow defect exposed on a surface of the SiC substrate 10 and having a diameter larger than 1 μm. Micropipes can be identified using transmission X-ray topography. The micropipes have a strong distortion and exhibit a dark, point-like contrast. Therefore, in transmission X-ray topography, the micropipes can be distinguished from other defects by utilizing a difference in contrast. For example, when micropipes are identified by the transmission X-ray topography, a contrast of point-like defects caused by a distortion of the micropipe is three times or more a contrast of point-like defects caused by a threading dislocation.

Also, the micropipes may also be evaluated using optical microscopy and photoluminescence methods in addition to transmission X-ray topography. The micropipes are identified as unevenness when observed using an optical microscope. Also, the micropipes are also identified as dark spots accompanied by bright points when observed using a photoluminescence method. When the micropipes are observed using a plurality of evaluation methods, an accuracy of identifying micropipes can be improved.

After distinguishing between micropipes and other defects using the above-described procedure, a micropipe density and the number of micropipes in the SiC substrate 10 can be determined by counting the number of the micropipes. The position coordinates of the micropipes can be calculated from position coordinates of a full-surface image of a transmission X-ray topography image. Also, the micropipe density can be calculated by dividing the number of the micropipes by an area of the substrate.

Figure 2:
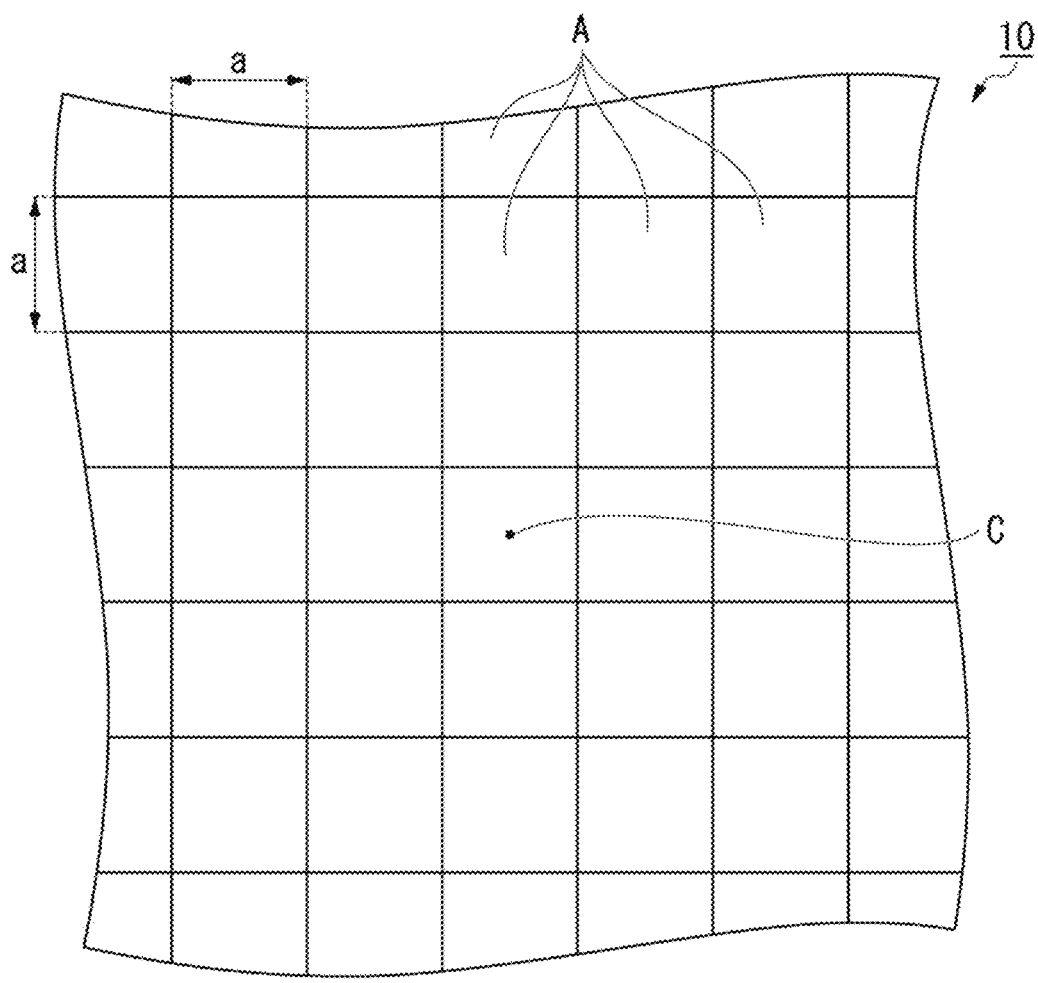
FIG. 2 is an enlarged view in the vicinity of a center of the SiC substrate according to the present embodiment.

The SiC substrate 10 is cut into a plurality of chips to obtain devices. For example, the SiC substrate 10 is partitioned into a plurality of regions in accordance with a size of the chip. FIG. 2 is an enlarged view in the vicinity of a center C of the SiC substrate 10 according to the present embodiment. For example, the surface of the SiC substrate 10 is partitioned into a plurality of regions A. Each of the regions A is a square with a side length a. The regions A are laid out over the surface of the SiC substrate 10 without any gaps. A center of one of the plurality of regions A coincides with the center C of the SiC substrate 10. Each of the regions A corresponds to an individual chip to be diced, each of which becomes a SiC device.

A size of the region A varies according to a size required for a device. An area of the region A varies according to the length a of one piece.

A square region having the length a of 2 mm and the area of 4 mm² is referred to as a first region.

A square region having the length a of 3 mm and the area of 9 mm² is referred to as a second region.

A square region having the length a of 4 mm and the area of 16 mm² is referred to as a third region.

A square region having the length a of 5 mm and the area of 25 mm² is referred to as a fourth region.

A square region having the length a of 6 mm and the area of 36 mm² is referred to as a fifth region.

A square region having the length a of 7 mm and the area of 49 mm² is referred to as a sixth region.

A square region having the length a of 8 mm and the area of 64 mm² is referred to as a seventh region.

A square region having the length a of 9 mm and the area of 81 mm² is referred to as an eighth region.

A square region having the length a of 10 mm and the area of 100 mm² is referred to as a ninth region.

A square region having the length a of 15 mm and the area of 225 mm² is referred to as a tenth region.

A square region having the length a of 20 mm and the area of 400 mm² is referred to as an eleventh region.

An example of the region A has been illustrated here, but a size of the region is not limited thereto. For example, a length of one piece may be 11 mm, 12 mm, 13 mm, 14 mm, 15 mm, 16 mm, 17 mm, 18 mm, 19 mm, and the length of one piece is not limited to an integer number.

If the region A is the first region, among the plurality of first regions included in the SiC substrate 10, 7209 or more of the first regions preferably have no micropipes. The number of the first regions belonging to the effective region 1 is 7209, and if none of these have micropipes, a maximum number of SiC devices can be obtained from one SiC substrate 10.

If the region A is the second region, among the plurality of second regions included in the SiC substrate 10, 3168 or more of the second regions preferably have no micropipes. The number of the second regions belonging to the effective region 1 is 3168.

If the region A is the third region, among the plurality of third regions included in the SiC substrate 10, 1764 or more of the third regions preferably have no micropipes. The number of the third regions belonging to the effective region 1 is 1764.

If the region A is the fourth region, among the plurality of fourth regions included in the SiC substrate 10, 1116 or more of the fourth regions preferably have no micropipes. The number of the fourth regions belonging to the effective region 1 is 1116.

If the region A is the fifth region, among the plurality of fifth regions included in the SiC substrate 10, 764 or more of the fifth regions preferably have no micropipes. The number of the fifth regions belonging to the effective region 1 is 764.

If the region A is the sixth region, among the plurality of sixth regions included in the SiC substrate 10, 556 or more of the sixth regions preferably have no micropipes. The number of the sixth regions belonging to the effective region 1 is 556.

If the region A is the seventh region, among the plurality of seventh regions included in the SiC substrate 10, 421 or more of the seventh regions preferably have no micropipes. The number of the seventh regions belonging to the effective region 1 is 421.

If the region A is the eighth region, among the plurality of eighth regions included in the SiC substrate 10, 329 or more of the eighth regions preferably have no micropipes. The number of the eighth regions belonging to the effective region 1 is 329.

If the region A is the ninth region, among the plurality of ninth regions included in the SiC substrate 10, 262 or more of the ninth regions preferably have no micropipes. The number of the ninth regions belonging to the effective region 1 is 262.

If the region A is the tenth region, among the plurality of tenth regions included in the SiC substrate 10, 112 or more of the tenth regions preferably have no micropipes. The number of the tenth regions belonging to the effective region 1 is 112.

If the region A is the eleventh region, among the plurality of eleventh regions included in the SiC substrate 10, 58 or more of the eleventh regions preferably have no micropipes. The number of the eleventh regions belonging to the effective region 1 is 58.

Figure 3:
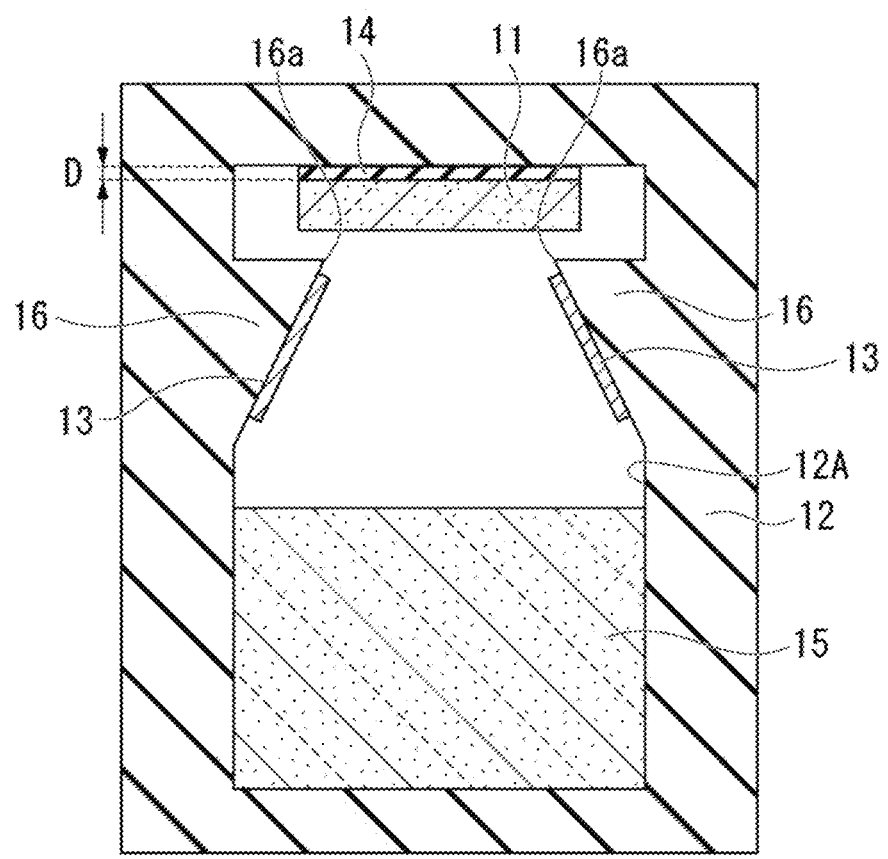
FIG. 3 is a view for explaining a manufacturing method of the SiC substrate according to the present embodiment.

Next, a manufacturing method of the SiC substrate 10 according to the present embodiment will be described. FIG. 3 is a view for explaining the manufacturing method of the SiC substrate 10 according to the present embodiment. The manufacturing method of the SiC substrate 10 includes a seed crystal preparation step, a crucible preparation step, a seed crystal placement step, a raw material placement step, a crystal growth step, and a slicing step.

First, in the seed crystal preparation step, a seed crystal 11 is prepared. In the seed crystal 11, a crystal not including micropipes is prepared. The seed crystal 11 not including micropipes can be produced using, for example, a repeated a-face (RAF) method.

Next, in the crucible preparation step, a crucible 12 to be used for a crystal growth is prepared. The crucible 12 is made of graphite and is prepared such that a part of an inner wall surface 12A thereof is covered with a coating film 13. The coating film 13 is made of TaC. An area of 10% or more to 50% or less of the inner wall surface 12A of the crucible 12 is covered with the coating film 13. Here, the inner wall surface 12A means a surface of an inner surface of the crucible that is not covered with a raw material 15 and is exposed to a growth space.

If the covered area of the coating film 13 is too small, carbon dust generated from the inner wall surface 12A of the crucible 12 is likely to be incorporated into the growing crystal. Carbon inclusions incorporated into the crystal cause generation of micropipes. Also, if the covered area of the coating film 13 is too large, supply of a carbon gas from the inner wall surface 12A of the crucible 12 decreases, and different polytypes of SiC tend to be generated in the growing crystal. The different polytypes of SiC also cause generation of micropipes. Covering a predetermined area of the inner wall surface 12A of the crucible 12 with the coating film 13 is one factor in preventing generation of the micropipes in the SiC substrate 10.

Also, the coating film 13 is disposed at a position on the inner wall surface 12A close to the seed crystal. For example, if the crucible 12 has a guide member 16, a part of the guide member 16 is covered with the coating film 13. Specifically, a surface of the guide member 16 is covered with the coating film 13 from a position 5 mm away from a first end 16a of the guide member 16 to a position 100 mm away from the first end 16a. Here, the first end 16a is an end portion of the guide member 16 on the seed crystal 11 side. When the guide member 16 is partially covered with the coating film 13, generation of different polytypes can be suppressed while suppressing dust generation. A state of generation of micropipes in the SiC substrate 10 also changes according to a position in which the coating film 13 is placed.

Next, in the seed crystal placement step, the seed crystal 11 is placed in the crucible 12. The seed crystal 11 may be placed on the inner wall surface 12A of the crucible 12, or may be placed on a pedestal placed on the inner wall surface 12A. The pedestal is made of, for example, the same material as the crucible 12.

The seed crystal 11 is placed in the crucible 12 with, for example, an adhesive 14. At this time, the seed crystal 11 is placed on the crucible 12 so that a shortest distance D between a back surface of the seed crystal 11 and a placement surface of the seed crystal 11 is 30 µm or less at any position in an in-plane direction of the seed crystal 11. The placement surface is the inner wall surface 12A of the crucible 12 when the seed crystal 11 is directly placed in the crucible 12, and is an exposed surface of the pedestal when the seed crystal 11 is placed on the pedestal. The in-plane direction of the seed crystal 11 is an in-plane direction in which the seed crystal 11 extends, and coincides with a direction in which a plane orthogonal to a straight line connecting the seed crystal 11 and the raw material 15 at the shortest distance extends. The shortest distance D between the back surface of the seed crystal 11 and the placement surface of the seed crystal 11 does not change significantly before and after heating during the crystal growth, and therefore may be measured either before or after the heating. Further, the adhesive 14 is carbonized when heated. A gap may occur between a surface of the carbonized adhesive 14 and the seed crystal 11. A thickness of the gap (a shortest distance between the carbonized surface of the adhesive 14 and the seed crystal 11) is set to 10 µm or less.

When a distance between the seed crystal 11 and the placement surface increases, the seed crystal 11 is positioned relatively closer to the raw material 15. A temperature becomes higher at a position closer to the raw material 15, and etching of the seed crystal 11 is likely to occur in a high-temperature environment. When the seed crystal 11 is etched, the adhesive 14 or the placement surface is exposed. Polycrystalline SiC is likely to grow on the exposed portion of the adhesive 14 or the placement surface. Micropipes are likely to generate in the polycrystalline SiC. When the distance between the seed crystal 11 and the placement surface is appropriately controlled, generation of the micropipes in the SiC substrate 10 can be suppressed. Also, the gap between the surface of the carbonized adhesive 14 and the seed crystal 11 disturbs a temperature uniformity within the plane during the crystal growth, causing a rise in temperature. In a portion in which the temperature has become locally high, etching accelerates, and the adhesive 14 or the placement surface is exposed. Therefore, when the gap between the surface of the adhesive 14 and the seed crystal 11 is not allowed to be formed or made sufficiently narrow, generation of micropipes in the SiC substrate 10 can be further suppressed.

Next, in the raw material placement step, the raw material 15 is placed in a lower portion of the crucible 12. The raw material 15 is, for example, a SiC powder. In the raw material placement step, the raw material 15 is placed so that a shortest distance between an outermost surface of the raw material 15 and the seed crystal 11 is 150 mm or more. When the distance between the raw material and the seed crystal is increased, a risk of the seed crystal becoming high in temperature and being etched can be reduced.

Next, the crystal growth step is performed by a sublimation method. In the sublimation method, when the crucible 12 is heated, a sublimation gas sublimated from the raw material 15 in the crucible 12 is supplied to the seed crystal 11, and the seed crystal 11 is grown to a larger SiC ingot. The SiC ingot grows on the seed crystal 11.

In the crystal growth step, the SiC ingot is grown to 10 mm or more. An amount of radial expansion of the SiC ingot with respect to the seed crystal 11 is set to 5 mm or more and 10 mm or less. The amount of radial expansion is a value obtained by subtracting a diameter of the seed crystal 11 from a maximum diameter of the SiC ingot. In the radial expansion of the SiC ingot, a predetermined amount of radial expansion can be obtained by adjusting a shape of the guide member 16 that increases a flow of the sublimation gas. The amount of radial expansion is set to 5 mm or more and 10 mm or less by adjusting an amount of growth of the SiC ingot according to the shape of the guide member 16. If the amount of radial expansion is 5 mm or less, it is necessary to repeat the radial expansion a plurality of times to obtain a large-diameter crystal, making it difficult to produce a large-diameter crystal.

On the other hand, if the diameter of the crystal is enlarged too much during the crystal growth, a stress is generated within the crystal. If the amount of radial expansion during the crystal growth is too large, stress concentration may occur, and cracks may occur inside the crystal. The cracks cause generation of micropipe defects. In the crystal growth step, generation of micropipes in the SiC substrate 10 can be suppressed by controlling the radial expansion of the crystal to 10 mm or less.

Next, in the slicing step, the SiC substrate 10 is cut out from the SiC ingot. For example, the SiC ingot is hollowed out into a column of a predetermined diameter, and the column is sliced to produce the SiC substrate 10. The slicing may be performed using a laser, or may be performed using a wire saw or the like.

As described above, when the seed crystal preparation step, the crucible preparation step, the seed crystal placement step, the raw material placement step, the crystal growth step, and the slicing step are each performed and controlled, it is possible to produce the SiC substrate 10 having few micropipes even when they have a large diameter.

The SiC substrate 10 according to the present embodiment has few micropipes despite its large diameter. Therefore, a large number of non-defective SiC devices can be obtained from the SiC substrate 10 according to the present embodiment. The SiC device is obtained by dicing the SiC epitaxial wafer into chips for each region A. FIG. 4 is a cross-sectional view of the SiC epitaxial wafer 100 according to the present embodiment. The SiC epitaxial wafer 100 has the SiC substrate 10 and a SiC epitaxial layer 20. The device is formed on the SiC epitaxial layer 20.

Although the preferred embodiment of the present invention has been described in detail above, the present disclosure is not limited to the specific embodiment, and various modifications and changes can be made within the range of the gist of the present disclosure described in the claims.

EXAMPLE

Example 1

First, a seed crystal was prepared. A 4H—SiC single crystal having a diameter of 197 mm was prepared as the seed crystal.

Next, a crucible was prepared. The crucible used was a crucible in which 39% of an inner wall surface was covered with TaC. The coating film made of TaC was formed on a part of an inner surface of a guide member in the vicinity of the seed crystal of the crucible. Specifically, the guide member was covered with TaC from a position 5 mm away from a first end on the seed crystal side to a position 100 mm away therefrom.

Next, the seed crystal was placed on the inner wall surface of the crucible. The seed crystal was placed on the inner wall surface using an adhesive. The adhesive used was a carbon adhesive with a thickness of 20 μm. A distance between a back surface of the seed crystal and a placement surface of the seed crystal after the seed crystal was placed remained at 20 μm because there was no peel off of the adhesive, and no gap was formed between the carbonized adhesive and the seed crystal.

Next, a bottom surface of the crucible was filled with the raw material. A SiC powder was used for the raw material. A distance between an outermost surface of the raw material and a surface of the seed crystal was 200 mm.

Next, a SiC ingot was grown on the seed crystal using a sublimation method. An amount of crystal growth (thickness of the SiC ingot) was 25 mm. Also, an amount of radial expansion of the SiC ingot with respect to the seed crystal was 8 mm.

Next, the produced SiC ingot was sliced, and then a SiC substrate was obtained by polishing a (0001) surface of the sliced substrate in order of grinding, mechanical polishing (MP), and chemical mechanical polishing (CMP). The surface of the SiC substrate was measured by transmission X-ray topography to determine the number of micropipes contained inside the SiC substrate.

The number of micropipes contained inside the SiC substrate of example 1 was one. The one micropipe was within the effective region, but was in the vicinity of the edge exclusion region. Therefore, a device acquisition region could be distinguished by excluding micropipes from the region from which devices are obtained.

Therefore, from the SiC substrate of example 1, it was possible to obtain regions having no micropipes according to a size of the region. The number of regions corresponds to the number of devices to be acquired.

First region: 7209
Second region: 3168
Third region: 1764
Fourth region: 1116
Fifth region: 764
Sixth region: 556
Seventh region: 421
Eighth region: 329
Ninth region: 262
Tenth region: 112
Eleventh region: 58

As described above, in example 1, even with an 8-inch large-diameter substrate, the SiC substrate with few micropipes was obtained. In example 1, reproducibility was achieved even in a plurality of times of experiments. Further, a crystal with few micropipes, which was obtained by performing the radial expansion a plurality of times using the same method as in example 1, was used for the seed crystal in example 1.

EXPLANATION OF REFERENCES

1 Effective region
2 Edge exclusion region
3 Notch
10 SiC substrate
A region
C Center
11 Seed crystal
12 Crucible
12A Inner wall surface
14 Adhesive
15 Raw material
20 SiC epitaxial layer
100 SiC epitaxial wafer

What is claimed is:

1. A SiC substrate having a diameter of 195 mm or more and a micropipe density of $0.01/cm^2$ or less.

2. The SiC substrate according to claim 1, wherein the number of micropipes in an effective region excluding an edge exclusion region within 3 mm from an outer circumference is three or less.

3. The SiC substrate according to claim 1, wherein the number of micropipes in an effective region excluding an edge exclusion region within 3 mm from an outer circumference is one or less.

4. The SiC substrate according to claim 1, wherein, among a plurality of first regions obtained by partitioning a surface into squares each having an area of 4 $mm^2$, 7209 or more of the first regions have no micropipes.

5. The SiC substrate according to claim 1, wherein, among a plurality of second regions obtained by partitioning a surface into squares each having an area of 9 $mm^2$, 3168 or more of the second regions have no micropipes.

6. The SiC substrate according to claim 1, wherein, among a plurality of third regions obtained by partitioning a surface into squares each having an area of 16 $mm^2$, 1764 or more of the third regions have no micropipes.

7. The SiC substrate according to claim 1, wherein, among a plurality of fourth regions obtained by partitioning a surface into squares each having an area of 25 $mm^2$, 1116 or more of the fourth regions have no micropipes.

8. The SiC substrate according to claim 1, wherein, among a plurality of fifth regions obtained by partitioning a surface into squares each having an area of 36 $mm^2$, 764 or more of the fifth regions have no micropipes.

9. The SiC substrate according to claim 1, wherein, among a plurality of sixth regions obtained by partitioning a surface into squares each having an area of 49 $mm^2$, 556 or more of the sixth regions have no micropipes.

10. The SiC substrate according to claim 1, wherein, among a plurality of seventh regions obtained by partitioning a surface into squares each having an area of 64 $mm^2$, 421 or more of the seventh regions have no micropipes.

11. The SiC substrate according to claim 1, wherein, among a plurality of eighth regions obtained by partitioning a surface into squares each having an area of 81 $mm^2$, 329 or more of the eighth regions have no micropipes.

12. The SiC substrate according to claim 1, wherein, among a plurality of ninth regions obtained by partitioning a surface into squares each having an area of 100 $mm^2$, 262 or more of the ninth regions have no micropipes.

13. The SiC substrate according to claim 1, wherein, among a plurality of tenth regions obtained by partitioning a surface into squares each having an area of 225 $mm^2$, 112 or more of the tenth regions have no micropipes.

14. The SiC substrate according to claim 1, wherein, among a plurality of eleventh regions obtained by partitioning a surface into squares each having an area of 400 $mm^2$, 58 or more of the eleventh regions have no micropipes.

15. The SiC substrate according to claim 1 having a diameter of 205 mm or less.

16. A SiC epitaxial wafer comprising the SiC substrate according to claim 1, and a SiC epitaxial layer laminated on the SiC substrate.

* * * * *